United States Patent
Kennedy

[19]

[11] Patent Number: 6,074,725
[45] Date of Patent: Jun. 13, 2000

[54] FABRICATION OF MICROFLUIDIC CIRCUITS BY PRINTING TECHNIQUES

[75] Inventor: Colin Kennedy, Mill Valley, Calif.

[73] Assignee: Caliper Technologies Corp., Mountain View, Calif.

[21] Appl. No.: 08/987,803

[22] Filed: Dec. 10, 1997

[51] Int. Cl.[7] .............................. B32B 3/22; B32B 31/00; G01N 30/00

[52] U.S. Cl. .................. 428/188; 428/198; 428/204; 428/206; 428/210; 156/277; 156/290; 156/292; 427/2.11; 73/23.39; 73/61.53; 204/603; 436/180

[58] Field of Search .................................... 156/277, 290, 156/291, 292; 428/120, 188, 198, 201, 204, 207, 209, 210, 206; 204/603, 604; 210/198.2, 656; 366/336, 340; 73/23.39, 61.53; 427/2.11, 2.13; 436/180

[56] References Cited

U.S. PATENT DOCUMENTS

| | | | |
|---|---|---|---|
| 5,075,152 | 12/1991 | Tsukuda et al. | 428/204 |
| 5,171,132 | 12/1992 | Miyazaki et al. | 417/413 |
| 5,271,724 | 12/1993 | van Lintel | 417/413 |
| 5,277,556 | 1/1994 | van Lintel | 417/413 |
| 5,375,079 | 12/1994 | Trah | 417/52 |
| 5,376,252 | 12/1994 | Ekstrom et al. | 204/299 R |
| 5,736,188 | 4/1998 | Alcock et al. | 427/2.11 |
| 5,750,240 | 5/1998 | Findley et al. | 428/195 |
| 5,824,204 | 10/1998 | Jerman | 204/601 |

FOREIGN PATENT DOCUMENTS

| | | | |
|---|---|---|---|
| 0 568 902 A2 | 4/1993 | European Pat. Off. | F04B 43/04 |
| 2 248 891 | 4/1992 | United Kingdom | F04B 21/00 |
| WO 96/04547 | 2/1996 | WIPO . | |

OTHER PUBLICATIONS

McLaughlin et al., "Development of a Thick–Film Thermal Print Head", *International Microelectronic Symposium*, pp. 1A–4–1–1A–4–14 (1973).

Hann et al., "Dye Diffusion Thermal Transfer (D2T2) Color Printing", The Fifth *International Congress on Advances in Non–Impact Printing Technologies*, pp. 441–448 (1979).

*Primary Examiner*—Donald Loney
*Attorney, Agent, or Firm*—Mathew B. Murphy; Jonathan Alan Quine; The Law Offices of Jonathan Alan Quine

[57] ABSTRACT

Laminates having microfluidic structures disposed between sheets of the laminate are provided. The microfluidic structures are raised on a sheet of laminate, typically by printing the structure on the sheet. Printing methods include Serigraph, ink-jet, intaligo, offset printing and thermal laser printing.

37 Claims, 3 Drawing Sheets

FABRICATION OF MICROFLUIDIC CIRCUITS BY PRINTING TECHNIQUES

BACKGROUND OF THE INVENTION

Microscale devices for high throughput mixing and assaying of small fluid volumes have recently been developed. For example, U.S. Ser. No. 08/761,575 entitled "High Throughput Screening Assay Systems in Microscale Fluidic Devices" by Parce et al. provides pioneering technology related to Microscale Fluidic devices, including electrokinetic devices. The devices are generally suitable for assays relating to the interaction of biological and chemical species, including enzymes and substrates, ligands and ligand binders, receptors and ligands, antibodies and antibody ligands, as well as many other assays. Because the devices provide the ability to mix fluidic reagents and assay mixing results in a single continuous process, and because minute amounts of reagents can be assayed, these microscale devices represent a fundamental advance for laboratory science.

In the electrokinetic microscale devices provided by Parce et al. above, an appropriate fluid is electrokinetically flowed into and through a microchannel microfabricated (e.g., etched, milled, laser-drilled, or otherwise fabricated) in a substrate where the channel has functional groups present on its surfaces. The groups ionize when the surface is contacted with an aqueous solution. For example, where the surface of the channel includes hydroxyl functional groups at the surface, protons can leave the surface of the channel and enter the fluid. Under such conditions, the surface possesses a net negative charge, whereas the fluid will possess an excess of protons, or positive charge, particularly localized near the interface between the channel surface and the fluid. By applying an electric field along the length of the channel, cations will flow toward the negative electrode. Movement of the positively charged species in the fluid pulls the solvent with them. The steady state velocity of this fluid movement is generally given by the equation:

$$v = \frac{\epsilon \xi E}{4\pi \eta}$$

where v is the solvent velocity, $\epsilon$ is the dielectric constant of the fluid, $\xi$ is the zeta potential of the surface, E is the electric field strength, and $\eta$ is the solvent viscosity. The solvent velocity is, therefore, directly proportional to the surface potential. Examples of particularly preferred electroosmotic fluid direction systems include, e.g., those described in International Patent Application No. WO 96/04547 to Ramsey et al., as well as U.S. Ser. No. 08/761,575 by Parce et al. Examples of additional microfluidic fluid manipulation structures relying on pumps, valves, microswitches and the like are described in, e.g., U.S. Pat. Nos. 5,271,724, 5,277,556, 5,171,132, and 5,375,979. See also, Published U.K. Patent Application No. 2 248 891 and Published European Patent Application No. 568 902.

A typical microscale device can have from a few to hundreds of fluidly connected channels chambers and/or wells. Improved methods of making microscale devices which provide for simplified manufacturing, more precise construction and the like are desirable. In addition, the ability to more easily control channel height to width ratios, thereby affecting fluid flow in the channels is also desirable. This invention provides these and many other features.

SUMMARY OF THE INVENTION

The manufacture of microfluidic devices by machining grooves, channels or the like in various substrates (glass, plastics, metals, metalloids, ceramics, polymers, organics, etc.) can be time consuming and expensive. To overcome these problems, the present invention adapts printing technologies to print channel walls, well walls, or other desired structural features on a substrate, followed by application of a material over the printed channel walls, thereby providing a laminate having an enclosed channel.

In one embodiment, the invention provides a laminate having a first surface comprising a first planar section (e.g., a sheet of glass, polymer, plastic, ceramic, metalloid, organic material, acrylic, MYLAR®, or the like, having a substantially flat region) and a second surface comprising a second planar section (the second surface can be the same as the first surface in construction, or made from a different material). The first or second surface can be rigid or flexible. The laminate has a first channel disposed between the first planar section and the second planar section having at least one cross-sectional diameter between about 0.1 μm and 500 μm. The upper and lower walls of the channel are made from the upper and lower surfaces, with the channel having a first wall and a second wall in contact with the first planar section and the second planar section. The walls are raised in comparison to the first or second planar surfaces, e.g., as a result of having been printed on the surface, having typical heights of between about 0.1 μm and 500 μm, more typically between about 1 and 100 μm. The walls can be constructed from adhesive materials which bond the first and second surfaces together, such as a wax, a thermoplastic, an epoxy, a pressure sensitive material, or a photo-resistive material. In typical embodiments, the walls of the channel are printed on the first and/or second surface using a printing technology such as Serigraph printing, ink jet printing, intaligo printing, offset press printing, thermal laser printing or the like. In an alternate embodiment, the surfaces are clamped together with a clamp, e.g., with the channels being printed with a non-adhesive material. Spacers are optionally used to ensure uniform distance between the sheets of material. Clamps and spacers are optionally used on applications having adhesive channel walls as well, to improve adhesion of the surfaces and to ensure uniform distance between the sheets of material. Surfaces are optionally coated to modify surface properties.

Because the upper and lower portions of the channel are made from the first and second surfaces, the channel typically has a flat top and a flat bottom. One advantage of the laminate construction of the invention over lithographic and laser ablation or other machining methods is that the portions of the channel made up of the first or second surface have the same physicochemical properties as the rest of the surface, because the channel portion is not altered by chemical or physical processes. Thus, the properties of the channels of the invention are more predictable than prior art microfluidic device construction methods. Another advantage is that the width and height of the channel walls can easily be optimized to reduce turbulence in angled portions of a channel.

An additional advantage of the present invention is that laminates with multiple sheets having fluidic structures between the sheets can easily be constructed by laminating multiple layers of materials. This increases the possible complexity of fluidic structures, increasing the applicable uses for the resulting mirofluidic devices.

Methods of forming the laminates of the invention are also provided. In the methods, first and second surfaces, each having a first planar section, are provided. A first channel having a first and a second wall is applied to the first and/or second planar section (the first and second walls are raised in comparison to the first planar surface, and have at least one cross-sectional diameter between about 0.1 μm and 500 μm), and the first and second planar sections are bonded. The first channel is in contact with a portion of the second planar section. The first channel is applied to the first or second planar section by printing the channel on the first or second planar section. Preferred methods of printing include Serigraph printing, ink jet printing, intaligo printing, offset press printing, and thermal laser printing.

DEFINITIONS

Figure 1:
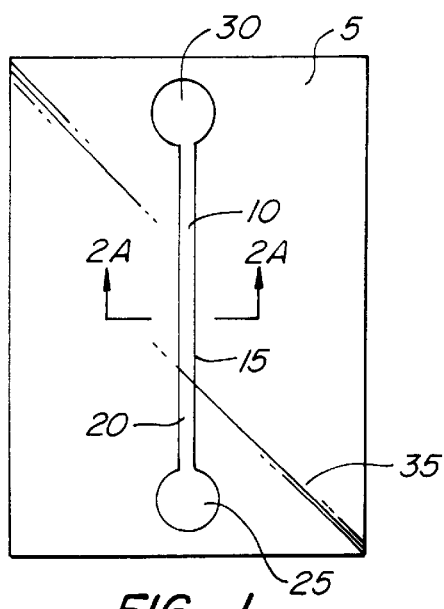
FIG. 1 shows a top view of a laminate including a microfluidic device having two wells and a single microfluidic channel.

A "laminate" is a structure having at least two layers of materials fixed, adhered or bonded together. Typically, in the present invention, the laminate will have two or more sheets of substrates adhered, glued or clamped together, with microfluidic elements such as channels, channel walls, wells, well walls, or the like disposed between the substrates. Ordinarily, at least the outlines of the microfludic elements are printed on one or both of the substrates, and the elements are fully formed by bonding the two or more substrates together. Ordinarily, the substrates take the form of sheets of material although one or both of the substrates may exist in other forms, such as a block of material with a face having a flat section.

In reference to a laminate, a "surface" is a face of a laminate or a face of a substrate or a face of a sheet of substrate used in forming a laminate. The surface ordinarily has a substantially flat region although it optionally has grooves, depressions or the like.

A "printed layer" is a layer of material amenable to deposition by printing. A variety of such materials are described herein. The printed layer is ordinarily between about 1 and 500 μm in thickness and is ordinarily applied to a selected surface using a printing technology such as ink-jet, Serigraph, intaligo, letter press printing, or the like, although it may also be applied manually.

An intermediate layer such as channel wall is "bonded" to a surface when the layer is adhered to the surface in a manner which does not permit removal of the layer under assay conditions typical for the device. Most typically, the intermediate layer is bonded by printing the intermediate layer on a surface; alternatively, the layer can be bonded by gluing the intermediate layer to the surface, or by embedding the intermediate layer in the surface, e.g., by partially dissolving the surface or the intermediate layer with a solvent and forcing the intermediate layer and the surface together.

DESCRIPTION OF THE PREFERRED EMBODIMENT

In previous embodiments, microfluidic devices were made by removing materials from a substrate to form a structural feature such as a channel bed, depression, or the like and bonding a second substrate to provide a cover to the structural feature (e.g., a top surface to a channel). In contrast, the present invention does not rely on removing substrate materials to make microfluidic structures. Rather than removing or modifying material to create channels, wells, chambers or other structural features in a substrate, in the present invention a material is deposited on a substrate, e.g., by printing a print material on the substrate. The print material is laid down in a pattern that defines the edges of fluidic structures, such as channels, chambers, wells or the like. Lamination of a substrate over the print material completes formation of the microfluidic structures outlined with the print material (e.g., by providing a top surface for a channel, well, chamber or the like).

The print material is deposited on any of a variety of commercially available materials such as sheet glass, or a polymer, in a pattern that defines the outer edges of fluid structures such as channels, wells or the like. A variety of print materials are suitable, including inks, waxes, plastics and many others described herein.

In one embodiment, the print material is used to adhere a "cover layer," or other secondary substrate to form the laminate. In this embodiment, the printed material forming the circuit of channel walls also serves as an adhesive to bond the sheets of the laminate together. The adhesive materials can be, e.g. a printable wax (especially thermal wax-based inks), laser copier toners, sol-gels, printable thermoplastic (including PMMAs, Polycarbonates and styrenes), printable epoxy (including UV curing epoxies), a hot melt adhesive, a pressure sensitive adhesive material, a photoresistive material, or the like.

Particles of materials which enhance fluid flow, or control channel wall size are optionally incorporated into the print material. Bonding is performed with pressure, RF, UV, thermal or ultrasonic methods, or any combination thereof. The methods allow fabrication of channel structures of any thickness and permit formation of laminates using thin polymer sheets which are laminated and die-cut. Material choices are thus not limited to those that can be processed by etching, machining, or molding. Because the laminates can be flexible, they can be manufactured in quantity and rolled. In addition, layered laminates having many layers of fluidic structures can be made, providing more options in microfluidic structure design.

Similarly, the geometry of printed microfluidic structures made using the methods described herein can be more flexible than prior art microfluidic devices. For example, there are fewer difficulties in producing intricate channel shapes using printing technologies than in micromachining channels. Aspect ratios of microfluidic channels can easily be selected by varying the thickness of the print material which makes up a selected microfludic structure (channel, well, etc.).

As described, because the upper and lower portions of the channel are made from the first and second surfaces, the channel typically has a flat top and a flat bottom. One important advantage of the laminate construction of the invention over etching, milling, laser drilling or other machining methods is that the portions of the channel made up of the first or second surface have the same physico-chemical properties as the rest of the surface, because the channel portion is not altered by chemical or physical processes (i.e., the channel portion is not altered by etching, heat, drilling, or the like). Thus, the properties of the channels of the invention are more predictable than previous construction methods. Another advantage is that the width and height of the channel walls can easily be optimized to reduce hydrodynamic effects. In addition, because the upper and lower portions of channels are symmetrical, flow properties in the channels are more regular and predictable.

The preferred embodiments of the present invention include printing a material on a substrate or sheet of substrate to form the outline of microfluidic structures, such as channels, wells, or the like. A variety of printing technologies are available, including inkjet printing, laser printing, silk-screening, Serigraph, intaligo, offset printing, letter press, Heidelberg press printing and the like, all of which can be adapted for use in the present invention.

For use in making a laminate of the invention, an "ink" or "print material" is applied to a sheet or other substrate suitable for receiving the ink, and suitable for use in a laminate of the invention. The shape of desired structural features such as channels and wells is outlined with the ink material and a second sheet is layed over the printed structure to create a laminate with channels, wells and the like. The ink material makes up the walls of the desired microfluidic structure.

A wide variety of printing methods useful for applying materials suitable for channel wall formation are known, and can be adapted to use in the present invention. Printing technologies are well illustrated in the scientific, patent and engineering literature, and many commercial embodiments are available; accordingly, no attempt is made to describe these processes in detail.

An introduction to printing methods is found in Kirk-Othmer Encyclopedia of Chemical Technology third and fourth editions, esp. volume 20, Martin Grayson, Executive Editor, Wiley-Interscience, John Wiley and Sons, NY, and in the references cited therein ("Kirk-Othmer"). Common printing methods include lithography, flexography, intaligo, letterpress, screen processes, thermal printing, electrophotography, and ink jet printing.

Ink Jet Printing of Microfluidic Structures

In one preferred method of printing channel walls, well walls and other structural features of microfluidic devices, ink jet printing systems are used. Again, ink jet printing is well described in the patent, engineering and scientific literature, and an introduction to Ink jet technology is found in Kirk-Othmer, id. and the references cited therein.

In brief, there are at least two general types of ink jet systems, i.e., "continuous stream" and "drop-on-demand" or "impulse". In continuous stream ink jet systems, ink is emitted in a continuous stream under pressure through at least one orifice or nozzle, and often through several separate orifices, e.g., where the ink jet print head has several orifices. The stream is perturbed, causing it to break up into droplets at a fixed distance from the orifice. The size and frequency of droplets is a function of pumping pressure, ink viscosity and nozzle size. Drops not needed for printing are electrostatically charged and deflected into a sump. In contrast, impulse printers generate drops in response to a specific data signal, e.g., from a microprocessor controlling the printing process.

There are two modes for continuous ink jet systems. In the "deflection" system, electrostatic deflection is used to adjust the trajectory of the ink material, permitting droplets to be targeted at a variety of angles for delivery to specific points on a substrate. In contrast, the "binary" system stream has only two trajectories: straight to a target on the substrate material printing the structural features of the microfluidic device (wells, channels, etc.) or into a recirculation unit such as a sump, channel or the like for re-use by the print head. The deflection system is typically used for lowresolution printing, making the binary system preferred for the present invention where a continuous ink jet system is used, as microfluidic structures are best constructed with high resolution printing methods.

Since impulse systems require no ink recovery, charging, or deflection, they are much simpler than the continuous stream type. There are also two types of impulse printers. The first type is a piezoelectric ink jet which propels a drop of material by flexing one or more walls in the print mechanism (often referred to as the "firing chamber") to decrease the volume of the material, causing material to be expelled from the print head. The pressure pulse resulting from the volume decrease can be controlled very precisely. The wall which flexes is typically a piezoelectric crystal or a pressure diaphragm driven by a piezoelectric element incorporated into the firing chamber.

Although the impulse system is simpler, the relatively large size of the piezoelectric transducer prevents close spacing of the ink jet nozzles, and physical limitations of the transducer results in low ink drop velocity. Low drop velocity diminishes tolerances for drop velocity variation and directionality, impacting the system's ability to produce high resolution microfluidic structures. Drop-on-demand systems which use piezoelectric devices to expel the droplets also suffer the disadvantage of a relatively slow printing speed. However, the technology for piezoelectric ink jet printing is well developed, and can be adapted to making microfluidic structures in the present invention.

The second type of impulse printer is a thermal impulse ink jet which utilizes rapid bubble formation of heated ink to propel drops from the ink jet print head. This system known as thermal ink jet, or bubble jet, and produces high velocity droplets allowing very close spacing of print head nozzles—and thus very high resolutions, making thermal ink jet printing preferred technology for printing fine microfluidic structures such as microchannel walls. The major components of this type of drop-on-demand system are an ink-filled channel having a nozzle on one end and a heat generating resistor near the nozzle. Printing signals representing digital information originate an electric current pulse in a resistive layer within each ink passageway near the orifice or nozzle causing the ink in the immediate vicinity to quickly evaporate creating a bubble in the ink. The ink at the orifice is forced out as a propelled droplet as the bubble expands. When the hydrodynamic motion of the ink stops, the process is ready to start over again. With the introduction of a droplet ejection system based upon thermally generated bubbles, commonly referred to as the "bubble jet" system, the drop-on-demand ink jet printers provide simple, lower cost devices than their continuous stream counterparts, and yet have substantially the same high speed printing capability. In both impulse and continuous stream systems, a print head can incorporate from one to hundreds of ink orifices, with more orifices generally resulting in higher resolution and faster printing speeds.

The selection of which type of ink jet system to apply to printing microfluidic structures in the present invention varies depending on the type of material printed from the print head. For example, high surface tension for the printed material results in good droplet formation. An increase in viscosity requires an increase in the energy required to pump and eject the material. Conductivity is important for continuous stream systems because the droplets are deflected electrostatically; thus, the droplets need to be charged. In contrast, low conductivity is preferred for impulse printing, particularly for thermal printing, because excess ions cause corrosion of the print head. Thus, selection of the material for use in outlining microfluidic structures, which is determined based on the application, is one consideration in determining which printing technology to use.

Selection of materials to be printed will vary depending on the application. Where non-aqueous solvents are to be flowed through the microfluidic device, an aqueous material can be used to form channel structures in contact with fluid flow. Often the material will include stabilizing agents such as humectants to inhibit drying of the ink in the printing mechanism. In contrast, where aqueous solutions are to be flowed through the printed microfluidic structures, it is generally less desirable to use an aqueous material for channel printing, to prevent dissolution of the channel by the flow of aqueous solutions. Thermally stable materials are desirable where the microfluidic device operates under a range of temperature conditions (e.g., where the device is used as a thermocycler, i.e., in a polymerase chain reaction (PCR) for DNA amplification.

Both aqueous and non-aqueous-solvent based "ink" materials are well known. Indeed, ink jet technology has been used to deposit a variety of materials, including liquid metals, fluxes, photoresists, epoxies, UV cured materials, alcohol, acetones, aliphatics, aromatics, dipolar solvents, DNA solutions, antibody solutions, buffers, sol-gels, thermoplastics, particle laden fluids, latex beads, metal particles and the like. See, e.g., Wallace (1996) Laboratory Automation News 1 (5): 6–9 and the references therein, where ink-jet based fluid microdispensing in Biochemical Applications is further described.

Electrophotography

In another method of printing channel walls, well walls and other structural features of microfluidic devices, electrophotographic systems are used. Again, electrophotography is well described in the patent, engineering and scientific literature. An introduction to electrophotography is found in Kirk-Othmer and the references cited therein. Additional details are found in Schafert (1980) *Electrophotography* Focal Press Boston Mass. and in Schein (1993) *Electrophotography and Development Physics*, Springer-Verlag, Berlin.

In brief, an electrophotographic system has two physicochemical elements: a photoreceptor and a toner. In the process, a photoconductive photoreceptor is uniformly charged, and the photoreceptor is selectively illuminated to form a latent electrostatic image. The image is then developed by applying a toner. Commonly, the electrostatic image (corresponding to a microfluidic structure or set of structures such as channels, channel walls, wells, etc.) is transferred to a substrate and thermal fusing of the toner on the substrate is performed to fix the image. This is typically followed by optical erasure of the residual charge and removal of residual toner. In application to the invention, the substrate on which the latent image is formed is a substrate of the invention, with the applied toner forming channel structures. One common example of an electrophotographic system is the ubiquitous office copier.

Lithography

In another method of printing channel walls, well walls and other structural features of microfluidic devices, lithographic or "planographic" systems are used. Again, lithography is well described in the patent, engineering and scientific literature. An introduction to Lithography is found in Kirk-Othmer and the references cited therein. Additional details are found in Hird (1991) *Offset Lithographic Technology*, Goodheart, N.Y.

In brief, lithography is a planographic process. Image, or printing areas, and non-image, or non printing reside in the same plane on a lithographic (or "offset") plate (generally made of aluminum or other metals, or of plastic) and are differentiated by the extent to which these areas accept printing ink. The lithographic or offset plate has one or more layers of radiation-sensitive compound. Typically, nonprinting areas are hydrophilic, accepting water and repelling ink while printing areas are oleophilic, repelling water and accepting ink. Reciprocal systems in which nonprinting areas are oleophilic (or hydrophobic), repelling a water-based ink and printing areas are hydrophilic accepting a water-based ink and repelling a hydrophobic solvent are also known. Regions which accept ink are designed to transfer an ink outline of the microfluidic structure (channel, well, etc.) desired, on a substrate of choice.

In the typical lithographic arrangement, water is applied to the surface of the printing plate (generally with various surfactants; the resulting mixture is known as a "fountain" solution) and the ink to be used to construct microfluidic structures is applied to the plate with rollers (or a "roller train"). The plate is typically made from aluminum with a radiation sensitive coating, although a wide variety of metals and polymers can also be used. There are two types of coatings, described based on their response to actinic radiation: positive coatings which degrade in response to radiation (becoming soluble in water or a solvent) and negative coatings which become less soluble in response to radiation (e.g., due to polymerization of the coating). Common radiation sensitive coatings for negative plates include diazo-based coatings, sulfuric acid derived salts and hydrochloric acid-derived salts. Common positive coatings include 1,2 -Napthoquinone diazide sulfonic acid esters.

The first step in making the printed image is to contact the radiation sensitive coating with a photographic film, which is then exposed to light in a desired pattern on the plate. The plate is then exposed to a solvent which removes soluble portions of the coating (defined by the image light), revealing the support surface in the selected areas. The surface in the revealed areas of the plate are strongly hydrophilic, repelling oil based materials (or, as described above, are strongly hydrophobic, repelling water-based materials). In the case of a "positive" working plate, it is the unexposed areas that provide the final image; in the case of a "negative" working plate the exposed areas provide the final image.

"Waterless" lithography is also useful. In this embodiment, the plates are primed and siliconized, with the siliconized areas typically being "ink" repellant (it will be appreciated that "ink" in this context is the material used to form microfluidic structures). Because there are no problems with solubilization of ink by water, it is possible to create sharper images, and thus finer and more regular microfluidic structures.

"Computer to Plate" lithography, which eliminates the film intermediate step is also performed. In this embodiment, thermal imaging is performed on a high speed photopolymer or silver halide is performed on diazo plates.

"Direct to press" lithography is preformed on a Heidelberg press. In this embodiment, printing plates are directly exposed to the substrate. A waterless printing plate is mounted on four units of a printing press. Each unit also has a laser head that scans the width of a cylinder plate as the plate slowly turns. The laser ablates a surface layer, exposing the "ink"-receptive surface of the plate. Printing can be performed as soon as the plates are ablated and exposed to ink.

Gravure

In another method of printing channel walls, well walls and other structural features of microfluidic devices, gravure printing processes are used. Again, gravure is well described in the patent, engineering and scientific literature. An introduction to gravure printing is found in Kirk-Othmer at volume 20, pages 99–101 and the references cited therein.

In brief, in the gravure process, which is also known as "intaligo" and as "rotogravure" utilizes a recessed image plate cylinder to transfer the image to the substrate. The plate cylinder can be either chemically or mechanically etched or engraved to generate the image. The volume of the engraved area determines the height of the microfluidic feature formed on a substrate. The gravure process is very simple, and yields very consistent results. Although the process has fallen out of favor because it is difficult to achieve half tones when printing standard ink images, this difficulty does not generally apply to the construction of features for microfluidic devices—there is generally no need to print a halftone in generating a microfluidic structural feature. Indeed, most features will be the same height and of uniform construction to ensure that the overlay substrate will close the feature, i.e., provide a "top" to a channel.

In the gravure system, a source of material to be printed on a substrate to form features of the invention is regularly contacted to a printing roll. Often the printing roll is squeegeed to ensure an even coating of printing material on the printing roll. The substrate passes between a second image roll having the structural features etched into the roll and the printing roll. The image roll presses the substrate into contact with the printing roll, causing direct transfer of the image to the substrate. Often, an electrostatic assist is used to transfer the print material. The print material typically dries, or sets, by evaporation.

Flexography

In another method of printing channel walls, well walls and other structural features of microfluidic devices, flexography is used. Again, flexography is well described in the patent, engineering and scientific literature. An introduction to flexography is found in Kirk-Othmer at volume 20, pages 101–05, and the references cited therein.

An advantage of flexography is the ability to print on a wide variety of substrates, including many of those useful in the present invention. For this reason, flexography is primarily used at present by industry to print on unusual surfaces such as cardboard, plastic films, foils, laminates and the like, e.g., for packaging applications.

In flexographic printing, a fountain pan supplies printing material to a rubber fountain roll, which in turn supplies material to an anilox roll. The anilox roll is central to the flexographic printing process, typically having a steel core, optionally coated with ceramic. The roll is engraved with cells and/or pits. The function of the anilox roll is to provide uniform "ink" distribution to the plate cylinder, which provides ink to a substrate. A doctor blade typically removes excess ink from the surface of the anilox roll. The printing material is passed between the plate cylinder and an impression cylinder, providing for transfer of the "ink" material to the substrate. There are three primary types of flexographic printing plates: molded rubber, solid sheet photopolymer and liquid photopolymer. Any of these are useful for transfer of material to a substrate of the invention for formation of microfluidic structures such as channel walls and well walls.

"Microcontact" printing, applicable to the present invention is described in U.S. Pat. No. 5,512,121.

Letterpress

In another method of printing channel walls, well walls and other structural features of microfluidic devices, letterpress printing is optionally used. Letterpress is well described in the patent, engineering and scientific literature, and has been used for several hundred years. An introduction to letter press is found in Kirk-Othmer at volume 20, page 105 and the references cited therein.

Letterpress is the oldest automated printing process, and is still one of the most precise, making it suitable for printing fine microfluidic structures in the present invention. Letterpress is printed directly by the relief method from cast metal or plates on which the image or printing areas are raised above the non-printing areas. Rollers apply the material to be printed to the surface of the raised areas, which transfer it directly to a substrate. Flat bed cylinder presses are useful, as are the more common rotary presses. Letterpress is less preferred than inkjet or other methods which use much simpler printing presses.

Screen Printing and Stencil Processes

There are two stencil processes in general use: screen printing and stencil duplicating. Screen printing typically used for art reproduction is referred to as "serigraphy". In one method of printing channel walls, well walls and other structural features of microfluidic devices, screen printing or stencil processes printing are used. These processes are in common use and well described in the patent, engineering and scientific literature, and have been used for several hundred years. An introduction to screen printing and stencil processes is found in Kirk-Othmer at volume 20, page 105–106 and the references cited therein. A review of screen printing techniques is found in Appleton (1984) *Screen Printing a Literature Review*, Pira international, Letterhead, Surrey, U.K.

In brief, screen printing is performed manually or by photomechanical means. The screens typically consist of silk or nylon fabric mesh with openings of 40–120 and often more, openings per lineal centimeter. The screen material is attached to a frame and stretched to provide a smooth surface. The stencil is applied to the bottom side of the screen, i.e., the side in contact with the substrate upon which microfluidic structures are to be printed. The print material is painted onto the screen, and transferred by rubbing the screen (which is in contact with the substrate) with, e.g., a squeegee. Screens typically last for up to about 100,000 printings. Note that in this embodiment, the stencil provides the outline of the portion of the microfluidic structures which are lowest, i.e., the "bottom" of a channel or well, while the unstenciled portion provides the raised areas, i.e., the channel walls. Typically, this results in a channel or well appearing against a background of a solid block of printed material, rather than the well or channel wall having discreet inner and outer walls.

Screen printing and Serigraph is also practiced by using rotary screens, made by plating a metal cylinder electrolytically on a steel cylinder, removing the cylinder after plating, applying a polymer coating to the cylinder, exposing it through a positive and a screen, developing the image and etching it. The result is a cylinder having a solid metal in the areas corresponding to raised features on the substrates in the microfluidic devices of the invention, and pores in the non-raised areas. Screen printing (Reviewed in Appleton, supra) is used generally in the manufacture of electrical circuit boards, and for printing textiles. Accordingly, very disparate substrates are easily printed using screen printing methods, making it applicable to the manufacture of microfluidic structures on a wide range of materials.

Thermal Printing

Thermal printing is a generic name for methods that mark a substrate by imagewise heating of special purpose consumable media. Common technologies include direct thermal (wax, transfer, etc.), and diffusion (dye-sublimation). Properties and preferred applications are diverse, but apparatus and processes are similar. For a review See, Kirk-Othmer, supra, at page 106–107 and the references cited therein. See also, Sturge et al. (1989) *Image Processes and Materials*, 8 th edition, Van Nostrad Reinhold Co., Inc., New York; Komersaka and Diamond (1989) in *Nonimpact Printing*, Graphic Arts Foundation, Pittsburgh, Pa., and McLaughlin (1973) *Proceedings of Microelectronic Symposium*, San Francisco, Calif.

Printheads are common to many thermal printing technologies. The heads are typically page-wide printed circuit-like arrays of uniform resistors. Alternatively, lasers replace printheads for precise thermal printing applications. In "direct" thermal printing, wax overlays are melted to reveal a substrate (e.g., a sheet of the laminate) below the wax. This technology is suitable for making channels wells and the like on substrates having meltable overlays, i.e., the desired microfluidic structure is carved out of the overlay with heat. In "thermal transfer" printing, imagewise transfer of wax or other material to a substrate is performed. This process is in common use for making transparencies, signs, high quality labels and the like. This process is suitable for printing features on the substrates of the invention. An alternative embodiment, dyesublimation thermal printing, occurs by submilation, condensation and diffusion. See also, Kirk Othmer, supra, at page 108–109 and the references cited therein, and Hahn and Beck (1980) *Proceedings of 5 th International Congress on Advances in Non-Impact Printing Technologies*, San Diego, Calif. pp. 441–448.

Additional non-printing methods

In addition to the printing methods described above, non-printing methods are also used to form channel structures in the present invention. In particular, thin films with microfluidic structures cut out of the sheet can be applied to a sheet to be laminated, films can be cut, laser etched, or the like after application to a sheet to be laminated, or the microfluidic structures can be applied by hand. Ordinarily, the film will be bonded to at least one sheet of the laminate, and often at least two sheets of the laminate. Similarly, screens or masks comprising microfluidic structures are applied to a sheet to be laminated and coated with an additional material. The screen is then removed, leaving an outline of the microfluidic structure in the additional material. Die or laser cut films comprising microfluidic structures such as microchannels and/or wells are preferred, as are screening and masking methods.

Ink Materials

The "ink" materials used in printing microfluidic structures such as channels, wells and the like are selected based upon the intended application. Example materials include e.g. wax (especially thermal wax-based inks useful in all of the thermal processes described herein), laser copier toners, sol-gels, thermoplastics (including PMMAs, Poly carbonates and styrenes), epoxies (including UV curing epoxies), hot melt adhesives, pressure sensitive materials, or photoresist. Particles of materials which enhance fluid flow, or control channel wall size are optionally added.

In certain embodiments, the laminates of the invention comprise separate sheets which are adhered together using an adhesive. As discussed, in preferred embodiments, the adhesive material is the "ink" which is printed on a substrate to form microfluidic structures such as channels and wells. In an alternate embodiment, the adhesive can be separate from rhicrofluidic structures, and used simply to bond two or more substrates together. As discussed, adhesive materials can be, e.g. wax (especially thermal wax-based inks), laser copier toners, sol-gels, thermoplastics (including PMMAs, Polycarbonates and styrenes), epoxies (including UV curing epoxies), hot melt adhesives, pressure sensitive materials, or photoresists. Particles of materials which enhance fluid flow, or control channel wall size are optionally added. Bonding can be performed with pressure, RF, UV, thermal or ultrasonic methods, or any combination thereof.

The selection of adhesive depends on the nature of the substrate, and upon the nature of the material to which the adhesive material is to be attached. In general, glues, cements, pastes, epoxies, and the like are suitable and widely available, as are mechanical adhesives such as threads, staples and the like. Adhesives are selected based upon the intended application, and it is expected that one of skill is thoroughly familiar with available adhesives and their use. For example, where the application is subjected to water, an adhesive which is waterproof is used. For a discussion of adhesives in particular applications, see, *the Adhesives Red Book* published by Argus Business, a division of Argus, Inc. Adhesive materials are used as print materials (ink), or are applied separate from print materials to adhere sheets of laminate together.

A wide variety of wax materials, useful in a wide variety of printing processes are known and discussed in the literature. For a brief introduction to waxes, see, Kirk-Othmer, volume 24 and the references cited therein. Insect and animal-derived waxes include beeswax and various waxes derived from animal fats. Vegetable-derived waxes include candellia, carnuba, Japan wax, ouricury wax, Douglas-Fir bark wax, ricebran wax, jojoba, castor wax, bayberry wax, and the like. Mineral waxes include montan wax, peat waxes, ozokerite and ceresin waxes, petroleum waxes (e.g., paraffin waxes consisting primarily of normal alkanes, scale waxes, and microcrystalline waxes), and the like. Synthetic waxes include polyethylene, Fischer-Tropsch (polymethylene), a wide variety of chemically modified hydrocarbon waxes, substituted amide waxes and the like. Waxes have a very wide range of physical properties, with melting temperatures from room temperature to 150° C. or higher, a range of viscosities, and the like. The use of waxes in thermal printing processes is well developed as described, supra, Accordingly, waxes have broad applicability as a print material for the construction of microfluidic structures in the present invention.

Sol-gel technologies are well known, and described, e.g., in Kirk-Othmer, supra at volume 22 and the references cited therein. Sols are dispersions of colloidal particles (nanoscaled elements) in a liquid such as water, or a solvent. Sol particles are typically small enough to remain suspended in the liquid, e.g., by Browninan motion. Gels are viscoelastic bodies that have interconnected pores of submicrometeric dimensions. Sol-gels are used in the preparation of glass, ceramics, composites, plastics or the like by preparation of a sol, gelation of the sol and removal of the liquid suspending the sols. This process is used in the many relatively low-temperature processes for the construction of fibers, films, aerogels, and the like. Three general processes for making sol-gels are typically used. In the first, gelatination of a dispersion of colloidial particles is performed. In the second, hydrolysis and polycondensation of alkoxide or metal salt precursors is performed. In the third, hydrolysis and polycondensation of alkoxide precursors followed by aging and drying at room temperature is performed. For further details, see, Kirk-Othmer, id. Applied to the present invention, sols are optionally deposited by the printing technologies described supra, followed by gelatination, hydrolysis, polycondensation, or the like.

Resists including photoresists are described in Kirk-Othmer Chemical Technology third and fourth editions, esp. volume 17 for the third edition and volume 9 for the fourth edition, Martin Grayson, Executive Editor, Wiley-Interscience, John Wiley and Sons, NY, and in the references cited therein. Resists are often temporary, thin coatings applied to the surface of a laminate. The films act like masks that are chemically resistant to deposition of additional materials. Thus, in the context of the invention, the interior portions of microfluidic structures (channels, wells, etc.) are printed or masked on a substrate with a resistive material, and the substrate is coated with an additional material. The resist is then removed, leaving the outline of a desired structure in the additional material. Alternatively, a resistive material can, itself, be the intermediate layer which bonds the laminate together.

A variety of screenable resists, including inks, silk, nylon, metal screening materials and the like can be used as resists. Photoresists are particularly preferred. Photoresists typically change chemically when exposed to light (typically UV), becoming more or less soluble in selected solvents. Photoresists can be used in masking strategies in a manner similar to screenable resists, and can also be used to print microfluidic structures such as such as a channel wall by printing the structure in photoresist and exposing the photoresist to light (in this application, the photoresist becomes less soluble upon exposure, i.e., due to polymerization).

Thermoplastics are useful both as ink components, and as substrates upon which microfluidic structures are formed. Plastics are classified as thermoplastic resins or as thermosetting resins, depending on how the plastic is affected by heat. When heated, thermoplastic resins soften and flow as liquids; when cooled, they solidify. These changes on heating and cooling can be repeated. Thermoplastics are thermally stable in their intended applications. Generally, thermoplastic products are made by melting thermoplastic compounds, and shaping and cooling the melt. When heated, thermosetting resins liquify and then solidify with continued heating due to crosslinking of the plastic during heating. Crosslinking is a permanent change; once molded, a thermoset plastic cannot be reheated and remolded. In contrast, thermoplastics can be reworked. A general introduction to thermoplastics, and to plastics in general, is found in Kirk-Othmer Encyclopedia of Chemical Technology third and fourth editions, esp. volume 18 and volume 23, Martin Grayson, Executive Editor, Wiley-Interscience, John Wiley and Sons, NY, and in the references cited therein. In the present application, thermoplastic or thermosetting resins are heated and printed on a substrate, e.g., using any of the various thermal printing methods discussed herein.

Many of the resins commonly used as commercial or industrial building materials are thermoplastics. These include crystalline resins such as various polyethelenes, nylons and polyesters, and amorphous thermoplastics such as acrylo-nitrile-butadine-styrene terpolymers (ABS plastics), cellulose acetate, phenylene oxide based resins, polycarbonates, poly(methyl methacrylate) (PMMA), polystyrene, polyvinylchloride (PVC), styrene-acrylonitrile copolymers (SAN) and various urethanes. Raw resins are available from a variety of commercial sources, typically in the form of pellets. Thermoplastics are optionally processed into microfluidic components, or act as substrates such as sheets or panels upon which microfluidic components are printed. Techniques for depositing thermoplastics include printing as discussed above, and can also include extrusion, blown film extrusion, cast film extrusion, extrusion of plastic sheets, profile extrusion, extrusion coating, wire coating, injection molding, structural foam molding, rotational molding, thermoforming, cast acrylic sheeting, expandable polystyrene molding, foamed polystyrene sheet extrusion, calendaring, thermosetting, reaction injection molding, and the like. See, Kirk-Othmer, supra.

Urethane plastics are an example of useful thermoplastics for use in the present invention. Urethane plastics are optionally used to form sheets, rolls, or other printable substrates, and are also useful as print materials, i.e., when urethane plastics or other thermoplastics are in solution (e.g., in a solvent) they can be sprayed through an ink-jet, or printed using the other methods herein. When printed on a thermoplastic substrate, the interaction of the solvent with the substrate causes the thermoplastic print material to become embedded in the thermoplastic substrate. The properties and methods of making thermoplastic and thermosetting plastics such as urethanes are known. Kirk-Othmer and the references cited therein provide a discussion of urethane polymers, e.g., at volume 23. A variety of manufacturing techniques are known for both thermoplastic and thermosetting urethanes, and polyurethanes and associated solvents, reagents, catalysts and the like are commercially available from J. P. Stevens (East Hampton, Mass.) as well as other commercial sources such as Akzo, BASF, Dow, Mobay, Olin, Rubicon, Upjohn, Bayer, Takeda, Veba, Eastman, Sun Oil, and other manufacturers known to persons of skill. See also, Kirk Othmer, id.

Substrates for Printing

An advantage of the present invention is that it provides for a wider choice of substrate materials for use in the microfluidic devices of the invention. In prior art microfluidic devices, channels, wells or the like were typically etched, machined, milled, cut, or formed in injectably molded materials. In contrast, in the present invention, any material can be used as a substrate or sheet in a laminate of the invention, provided the printed material is compatible with the substrate. Typically, substrates can include thin sheets of plastics or other polymers, glass, ceramic, metal, metalloid, organic material, acrylic, MYLAR®, or the like, having a substantially flat region. However, it will be appreciated that other materials can also be used, including coated papers, or the like. One of skill will perceive many suitable substrates depending on the application. Substrate selection is performed by considering the environmental operating parameters of the microfluidic device (temperature, pH operation range, salt operation range, need for conductivity if the device is electrokinetic, etc.), considering the properties of the print material (whether it will adhere to the substrate, whether it is caustic, etc.) and by considering the equipment available to the person of skill (e.g., type of printer to be used in laying out microfluidic structures). Many materials suitable for use as substrates or sheets in the laminates of the invention are described, e.g., in Kirk Othmer, id., and the references cited therein. It should be noted that many substrates are made suitable for use in a microfluidic device by applying a coating of material such as was, plastic, silicon, or the like to the surface of the substrate.

Continuous Manufacture of Laminates with Printed Layers

A particularly preferred feature of the invention is the ability to dramatically speed and simplify manufacturing of microfluidic devices. In particular, materials to be laminated such as plastic or other polymer sheets can be manufactured in large sheets, or rolls. Microfluidic structures are easily printed on these sheets or rolls of material using the printing technology described, supra, and a cover sheet or roll of material can be bonded to the printed sheet as described, supra, to provide laminates having closed microfluidic structures. The sheets or rolls are then cut into smaller sections to provide individual microfluidic devices. This process is optionally performed in a single continuous process, making it possible to generate large quantities of microfluidic devices. Alternatively, any of these operations can be performed separately. This is often desirable, e.g., where the sheets of the laminate are simply purchased from a commercial supplier, and printing, lamination and cutting processes are performed with the purchased sheets in a continuous process. In this regard, it will be appreciated that many polymer sheets, films and the like are widely available.

It will also be appreciated that the continuous manufacture of many polymer sheets and methods of laminating the sheets are well known, and can be combined with printing, lamination and cutting processes to provide microfluidic devices in a single continuous process. A wide variety of polymer sheet manufacturing techniques are known for producing sheets of polymer material including, e.g., various forms of extrusion, cast film, sheet, calendaring, and the like. See, e.g., Kirk-Othmer (1996) at volume 19 and the references cited therein for details on these manufacturing techniques. The sheets are optionally laminated by any of a variety of heat, pressure, and adhesive techniques, as described supra and as further described, e.g., in Kirk-Othmer at Volume 14.

Although optionally performed in a single process, it will be appreciated that any of the manufacturing steps are optionally separated, i.e., the planar surface produced using a sheet manufacturing technique can be manufactured, pieces exposed to an appropriate printing technology to form a printed layer and a second sheet of material mated to the printed surface in steps of separate manufacturing processes. However, one advantage of the present invention is that it provides for continuous manufacturing of a laminate.

Cast Film

In operation, cast film extrusion is optionally used with the printing techniques described, supra, in a single continuous process, to create a laminate. In particular, sheets of planar polymer are continuously produced by the extrusion process. Following water cooling on a chill roll, the material is dried and fed past a print head or other printer as described above and a printed layer is formed on the planar surface. A second sheet of material is optionally mated with the printed surface in a single continuous process to form a laminate of the invention. Optionally, the laminate formed by mating the second sheet of material with the printed surface is die-cut to produce a microfluidic device as described above.

Sheet

In one embodiment, sheet manufacture is combined with the printing technologies described herein in a single continuous process. In sheet manufacturing, a web of molten plastic is pulled from an extruder die into the nip between two pressure rollers. At the nip, there is a very small rolling bank of melt. Pressure between the rolls is adjusted to produce a sheet of the desired thickness and surface appearance. The necessary amount of pressure depends on the viscosity of the plastic or other polymer. For a given width, thickness depends on the balance between extruder output rate and the take-off rate of pull rolls. A change in either the extruder screw speed or the pull-roll speed affects sheet thickness. A constant thickness across the sheet requires a constant thickness of melt from the die. Sheet extrusion requires that the resin be of high melt viscosity to prevent excessive sag of the melt between the die and the nip. The melt should reach the nip before touching any other part of the middle roll to prevent uncontrolled cooling of the resin. There usually is no need for a high melt temperature to obtain flow through a sheeting die, because die openings are large. Cooling of the sheet is slow because sheeting is thick. Thus, sheet extrusion is suitable to the present invention, because the sheets used as printable surfaces have adequate structural rigidity for their use in microfluidic devices. Further details of sheet manufacturing are found in Kirk-Othmer, supra.

In operation, sheet extrusion is optionally used with the printing techniques described supra in a single continuous process to create a laminate. In particular, sheets of planar polymer are continuously produced by the extrusion process. Following cooling, the material is fed past a print head or other printer as described above and a printed layer is formed on the planar surface. A second sheet of material is optionally mated with the printed surface in a single continuous process. Optionally, the laminate formed by mating the second sheet of material with the printed surface is die-cut (or cut by any other known process) to produce a microfluidic device as described above.

Although described as single processes, it will be appreciated that any of the above continuous process steps are optionally separated, i.e., planar surfaces can be manufactured, exposed to an appropriate printing technology to form a printed layer and a second sheet of material mated to the printed surface in steps of separate manufacturing processes. However, one advantage of the present invention is that it provides for continuous manufacturing of a laminate.

Calendaring

In addition to extrusion methods of making sheets for use in the laminates of the invention, calendaring processes can also be used for making sheeting of uniform thickness from 0.75–0.05 mm after stretching. A calendar has four heavy, large steel rolls, which are usually assembled in an inverted "L" configuration. A two-roll mill, a Banbury mixer, or an extruder melt the resin, which is subsequently transferred to the calendar. Sheet can be made up to about 2.5 m wide and production rates can be as high as 100 m/min. Calendaring is followed by printing, and laminating as described above. As described for other manufacturing methods, a continuous process can be used for making the laminates of the invention, i.e., the sheets can be calendared, printed and laminated in a single continuous process.

Lamination

A variety of mating techniques to form the laminate from commercially available sheets or those manufactured by the processes described above are appropriate, depending on the print material, and all can be used in a continuous process with the manufacture of the sheet and printing of print layers on the sheets, or can be separated from either or both operations. As described supra, a variety of adhesive print materials are suitable, including those described supra.

Additional methods of lamination of two sheets (of polymer, glass or the like) are described in Kirk-Othmer at volume 14. Common types of adhesives used in continuous processes include thermoset polymers such as amino resins, polyesters, and epoxies. Any of these materials can be printed onto a sheet (or other substrate such as glass) as described above, and used as the adhesive between sheets.

"Treating" is a term used by the lamination industry to describe application of these thermoset polymers to materials to be laminated. As discussed above, in the present invention, these materials are applied by various printing processes to form print layers which adhere sheets of a laminate together. Alternatively, or in conjunction with printing methods, portions of the sheets to be laminated next to regions comprising printed microfluidic structures can have adhesives applied to aid in lamination. In one common embodiment, the print or other adhesive material is passed through a drying oven such as an air flotation oven (see, Kirk-Othmer at pp 1078–1079) to boil off unwanted solvents.

"Collation" is the process by which individual laminate sheets are assembled, i.e., placed in an appropriate physical relationship to each other. In many high-speed processes, the collated sheets are bonded by pressing into a laminate. A variety of presses are known. In one simple embodiment, the sheet with the printed material and the second sheet are fed through a roller to apply pressure between the two sheets. The print material or other adhesive adheres the sheets together. It will be appreciated that this technique has the advantage of forming a laminate of a continuous and uniform thickness, thereby causing microfluidic structures such as channel walls, chambers, wells, well walls and the like to have a uniform height, and to form a good seal between the sheets of the laminate. Similarly, the laminate can be formed simply by laying a sheet on top of the printed layer. Variations of heat and pressure are used, depending on the print material. A variety of other presses are suitable, including flatbed high and low pressure presses.

In a typical embodiment, the sheets of the laminate are heated in the press. The initial beating causes the adhesive resins (and/or the sheets of the laminate) to melt. The applied heat simultaneously causes the resin to polymerize and cross-link or gel. This is the point at which the curing process becomes dominant over the melt flow process. Dynamic mechanical and dielectric analyses are used to track this transition. With a sufficiently long press cycle, a state of complete cure is achieved. At this point, the laminate is cooled (typically in the press, under pressure, e.g., using a cooling plate).

Low pressure processes are especially suitable for the present invention, as microfluidic geometries can be distorted by high pressure processes. Low pressure processes are also generally of short duration, making these processes especially suitable for continuous processing (this is also an advantage in the present invention, as continuous processes are especially economical for manufacture of large numbers of components).

Additional Specific Embodiments

The present invention is further illustrated by consideration of the figures. The embodiments exemplified in the figures are provided by way of illustration and not by way of limitation. Those of skill will readily recognize a variety of noncritical parameters which could be changed or modified to yield essentially similar results.

FIG. 1 is a top view of first sheet 5 of a laminate of the invention comprising channel 10. Channel 10 includes raised walls 15 and 20, with the channel terminating in reservoirs 25 and 30. In operation, second sheet 35 typically overlays the first sheet, thereby providing channel 10 with a top and bottom portion. For simplicity of illustration, a very simple channel pattern is depicted; however it will be appreciated that many channel patterns can be produced in accordance with the present invention, including intersecting perpendicular channels, serpentine, saw tooth or any of a variety of other channel geometries. Substrates are of essentially any size, with area typical dimensions of about 0.5 cm$^2$ to 1000 cm$^2$. Typical sizes are in the range of 0.5–10 cm$^2$, e.g., about 1 to about 5 cm$^2$.

Figure 2A:
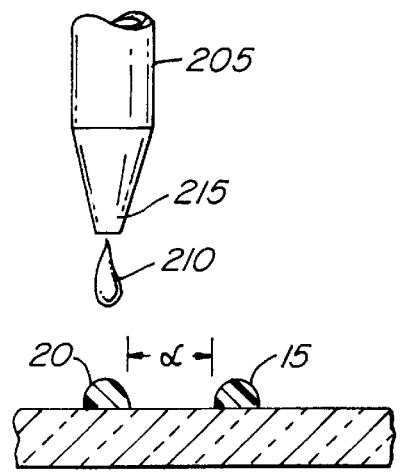
FIG. 2 panels A, B and C are side views showing construction of a laminate of the invention by dropping material to form a channel wall (panel A), and clamping the laminate (panel B and panel C).
Figure 2C:
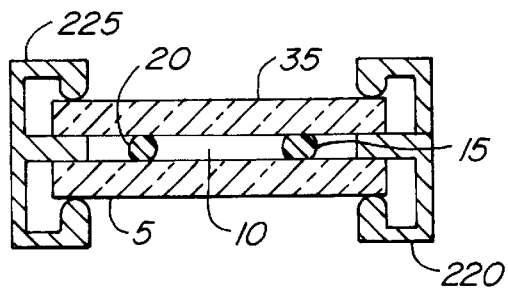
Figure 2B:
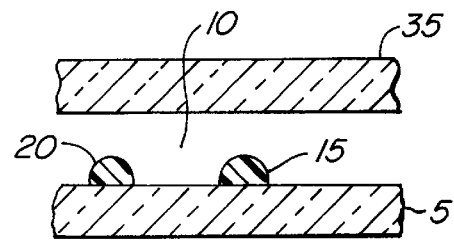

FIGS. 2A–2C show a preferred method of making channel 10. In particular, FIG. 2A shows ink jet printing head 205 spraying material 210 from nozzle 215 to form raised walls 15 and 20 having a defined width a. FIG. 2B shows second sheet 35 in the process of contacting lower sheet 5 to create a closed channel structure for channel 10. In one embodiment depicted in FIG. 2C, spacer clamps 220 and 225 are used to position second sheet 35 and first sheet 5 relative to each other in a manner in which second sheet 35 contacts raised walls 15 and 20, thereby forming channel 10.

Figure 3:
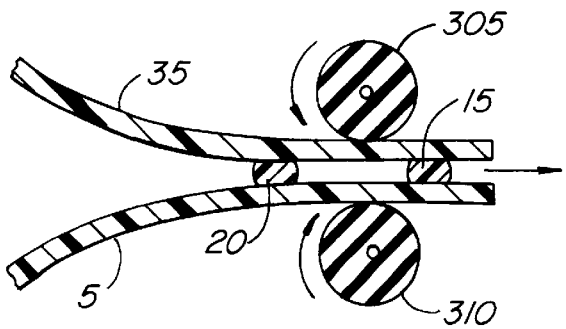
FIG. 3 is a side view showing construction of a laminate using a roller method.

FIG. 3 shows an alternative embodiment, in which first sheet 5 comprising raised walls 15 and 20 is laminated to second sheet 35 by pressing the sheets between rollers 305 and 310. In this embodiment, raised walls 15 and 20 are optionally constructed from an adhesive material which bonds sheets 5 and 35. Alternatively, sheets 5 and 35 can be bonded by pressure, heat or a combination of pressure and heat. Sheets 5 and 35 can be fed between rollers 305 and 310 in separate sheets, or in large rolls which are subsequently cut to form individual substrates.

Figure 4:
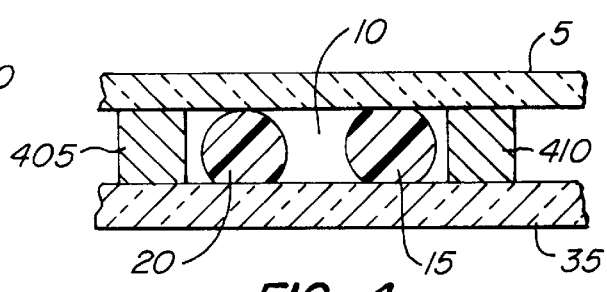
FIG. 4 is a side view showing a laminate having spacers.

FIG. 4 shows an alternative embodiment comprising spacers 405 and 410 which keep the distance between sheets 5 and 35 constant, thereby keeping the depth of channel 10 uniform. Many additional spacer embodiments are also appropriate; for example, beads can be incorporated into the material printed onto a substrate. Typical bead spacers range from 1–100 μm in size, e.g., about 10 μM.

Figure 5:
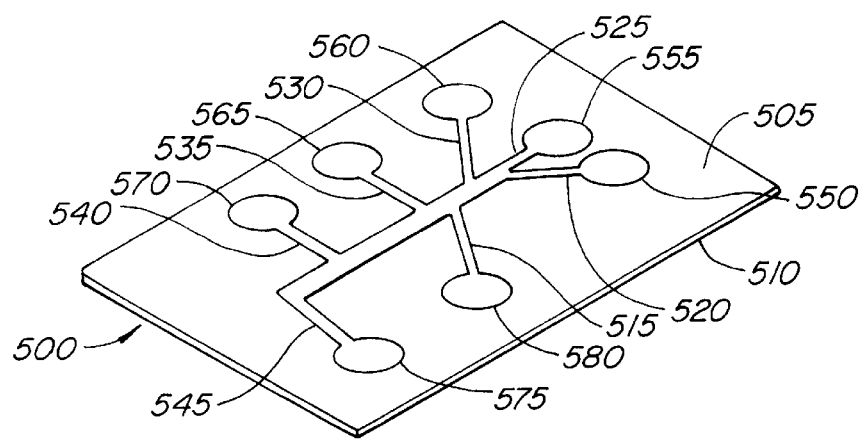
FIG. 5 shows a top view of a laminate including a microfluidic device having multiple wells and microfluidic channels.

FIG. 5 shows a top view of a more complex laminate 500 having top sheet 505 laminated to bottom sheet 510. The laminate includes channels 515–545 which are in fluid communication with each other and with reservoirs 550–580.

Figure 6:
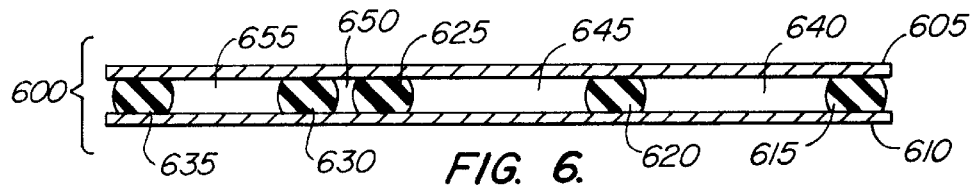
FIG. 6 is a side view of a laminate having multiple channels and channel walls.

FIG. 6 shows a cross sectional view of laminate 600 comprising parallel sheets 605 and 610, raised walls 615–635 and channels 640–655. Sheets 605 and 610 are a constant distance apart, with the distance being defined by, e.g., the viscosity of the material used to construct raised walls 615–635, the pressure used to bond sheets 605 and 610, environmental parameters such as temperature and humidity, and the like.

Figure 7:
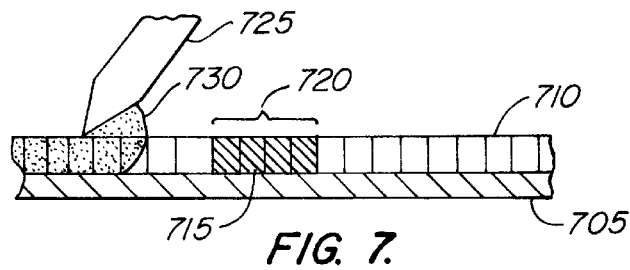
FIG. 7 is a top view showing a masking procedure for making a laminate of the invention.

FIG. 7 shows a masking method of making a channel on a substrate. Substrate 705 is masked by screen 710 comprising mask 715 which defines channel region 720. Applicator 725 deposits adhesive material 730 onto screen 710. Screen 710 prevents deposition of adhesive material 730 in channel region 720. After mask 715 is removed from channel region 720, a channel in channel region 720 results, with walls formed by deposited adhesive material 730.

Figure 8A:
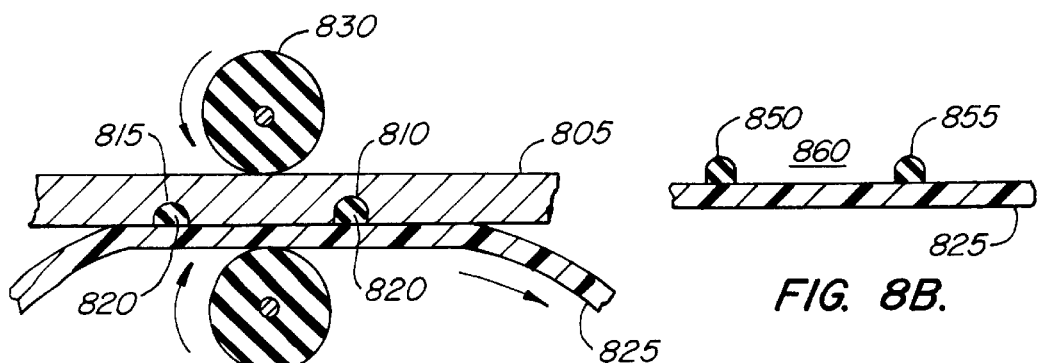
FIG. 8 panels A and B are side views showing intaligo printing to form channel walls in a microfluidic laminate.
Figure 8B:
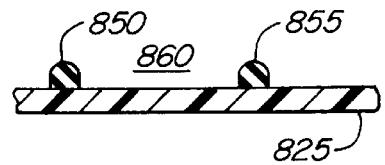

FIG. 8 A and FIG. 8B show an etching or engraving (intaligo) method of forming channels on a substrate. Plate 805 comprising raised regions 810 and 815 is coated with material 820, resulting in deposits of material 820 in raised regions 810 and 815. Substrate 825 is pressed against plate 805, for example by rollers 830 and 840, resulting in transfer of material 820 from raised regions 810 and 815 to substrate 825, thereby forming raised walls 850 and 855 defining channel 860. In subsequent procedures, a second substrate is laminated to substrate 825 to form a laminate of the invention.

Figure 9A:
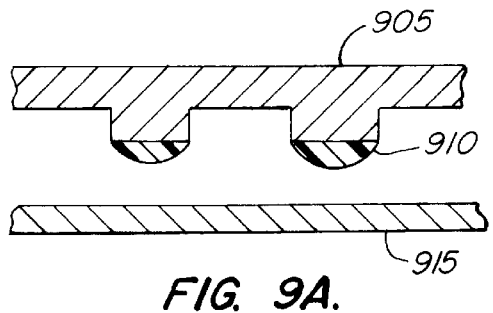
FIG. 9 panels A and B are side views showing offset printing to produce a laminate of the invention.
Figure 9B:
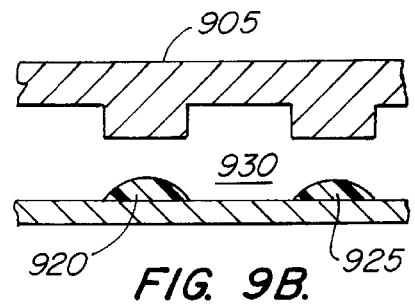

FIG. 9A and FIG. 9B show a "letter press" or "offset" style of forming a channel on a substrate for making a laminate of the invention. Letterpress 905 comprising material 910 presses material 910 onto substrate 915, resulting in the formation of raised channel walls 920 and 925 which define channel 930. In subsequent procedures, a second substrate is laminated to substrate 915 to form a laminate of the invention.

Figure 10A:
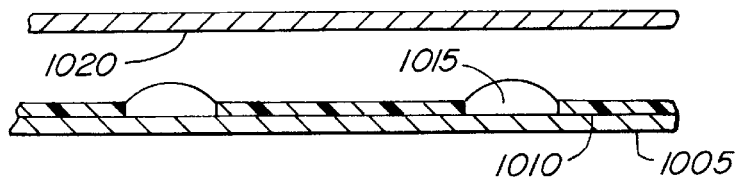
FIG. 10, panels A and B show channel formation on a substrate using lithography on a Heidelberg press.
Figure 10B:
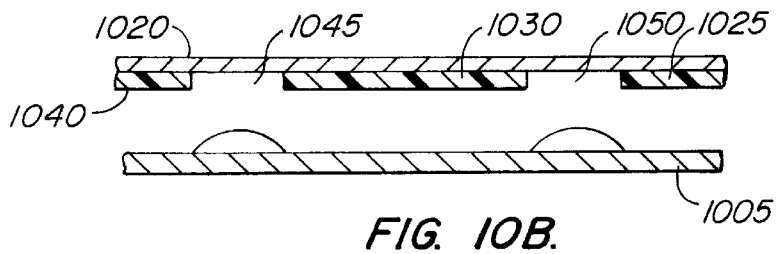

FIGS. 10A-10C Show channel formation on a substrate using lithography on a Heidelberg press. In brief, lithographic plate 1005 comprising regions with deposited material 1010 and regions without deposited material 1015 is pressed against substrate 1020, resulting in the formation of raised channel walls 1025–1040 defining channels 1045–1050. As depicted, regions without deposited material 1015 correspond to formation of channels 1045–1050. In one embodiment, regions of lithographic plate 1005 comprising deposited material 1010 are hydrophobic, while regions without deposited material 1015 are hydrophilic. Where deposited material 1010 is hydrophobic, it is preferentially deposited on the hydrophobic regions of lithographic plate 1005, without depositing on the hydrophilic regions. In a similar variation, regions of lithographic plate 1005 comprising deposited material 1010 are hydrophilic, while regions without deposited material 1015 are hydrophobic. Where deposited material 1010 is hydrophilic, it can be preferentially deposited on the hydrophilic regions of lithographic plate 1005, without depositing on the hydrophobic regions.

Figure 11:
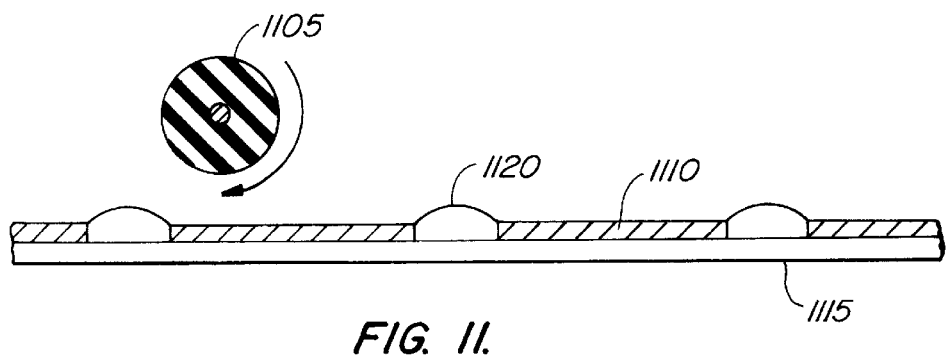
FIG. 11 is a side view showing a method of making a laminate of the invention by etching a deposited material on the surface of one sheet of the laminate.

FIG. 11 depicts a method of making a laminate of the invention by etching a deposited material on the surface of one sheet of the laminate. Roller 1105 rolls material 1110 onto the surface of sheet 1115. Etchant 1120 is applied before or after material 1110 to sheet 1115, either preventing deposition of material 1110, or removing material 1110 after it is deposited. In operation, a second sheet is adhered to sheet 1115, thereby providing a laminate with channels in the pattern etched by etchant 1120.

The present invention is illustrated by the foregoing embodiments, although one of skill will recognize many modifications which fall within the scope of the following claims. All publications and patent applications cited herein are incorporated by reference in their entirety for all purposes, as if each were specifically indicated to be incorporated by reference.

What is claimed is:

1. A laminate comprising:
a first surface comprising a first planar section;
a second surface comprising a second planar section;
an intermediate printed layer on at least one of the first and second planar sections, the intermediate printed layer disposed between the first and second planar sections, the intermediate printed layer defining first and second walls of at least a first microscale channel, which microscale channel comprises at least one cross-sectional dimension between about 0.1 $\mu$m and about 500 $\mu$m, the channel comprising the walls formed by the intermediate printed layer, a portion of the first planar section and a portion of the second planar section.

2. The laminate of claim 1, wherein the walls are formed from an intermediate printed layer produced by one or more of: Serigraph printing, ink jet printing, intaligo printing, offset press printing, thermal laser printing, silk screening, and Heidelberg press printing.

3. The laminate of claim 1, wherein the first surface comprises a first coating over a portion of the surface of the first planar section, wherein the first channel is formed in the coating.

4. A laminate comprising:
a first surface comprising a first planar section;
a second surface comprising a second planar section;
an intermediate printed layer on at least one of the first and second planar sections, the intermediate printed layer disposed between the first and second planar sections, the intermediate printed layer defining first and second walls of at least a first microscale channel, the channel comprising the walls formed by the intermediate printed layer, a portion of the first planar section and a portion of the second planar section.

5. The laminate of claim 1 or 4, wherein the first or second surface is rigid.

6. The laminate of claim 1 or 4, wherein the first or second surface is flexible.

7. The laminate of claim 1 or 4, wherein the first or second wall is between about 0.1 $\mu$m and 500 $\mu$m in height.

8. The laminate of claim 1 or 4, wherein the first or second wall is between about 1 $\mu$m and 100 $\mu$m in height.

9. The laminate of claim 1 or 4, wherein the first channel is a flat-bottomed channel.

10. The laminate of claim 1 or 4, wherein the first channel comprises a top region along a portion of the second planar section, a bottom region portion along a portion of the first planar section, and wherein the bottom region has the same physicochemical properties as the first planar section, and wherein the top portion has the same physicochemical properties as the second planar section.

11. The laminate of claim 1 or 4, wherein the first channel comprises an angled section and wherein the width of the first channel and the height of the first channel walls in the angled section is optimized to reduce turbulence of a liquid in the channel.

12. The laminate of claim 1 or 4, wherein the first wall and the second wall comprise an adhesive material which bonds the first planar surface and the second planar surface together.

13. The laminate of claim 12, wherein the adhesive material is selected from the group consisting of a wax, a thermoplastic, an epoxy, a pressure sensitive material, and a photoresistive material.

14. The laminate of claim 12, wherein the first channel is formed by printing an adhesive material to form the first and second adhesive walls.

15. The laminate of claim 1 or 4, wherein the first surface and second surface are independently selected from the group consisting of a glass, a polymer, a ceramic, a metalloid, and an organic material.

16. The laminate of claim 1 or 4, wherein the first surface and second surface are independently selected from the group consisting of an acrylic and MYLAR®.

17. The laminate of claim 1 or 4, further comprising a spacer between the first and second surfaces, which spacer provides a uniform separation between the first and second surfaces.

18. The laminate of claim 1 or 4, further comprising an adhesive material which bonds the first and second surfaces together.

19. The laminate of claim 1 or 4, further comprising a clamp which bonds the first and second surfaces together.

20. The laminate of claim 1 or 4, further comprising a second channel having at least an electrokinetic fluid direction means for moving fluid from the second channel to the first channel.

21. The laminate of claim 1 or 4, further comprising a second channel having at least one cross sectional dimension between about 0.1 μm and 500 μm, which second channel intersects with said first channel.

22. The laminate of claim 1 or 4, further comprising a third surface laminated to the second surface and a second channel located between the second surface and the third surface.

23. A method of forming a channel between two surfaces, the method comprising:

provuding a first surface comprising a first planar section;

providing a second surface comprising a second planar section; applying a first channel comprising a first and a second wall to the first or second planar section by a process comprising applying a printed layer comprising at least a portion of the first or second wall on the first or second planar substrate, wherein the first and second walls are raised in comparison to the first or second planar surfaces, and wherein the first channel comprises at least one cross-sectional diameter between about 0.1 μm and 500 μm; and, bonding the first and second planar sections, wherein the first channel is in contact with a portion of the first planar section and a portion of the second planar section.

24. The method of claim 23, wherein the steps of the method are performed in a single continuous process.

25. The method of claim 23, wherein the first channel intersects a second channel, which second channel is provided by printing the second channel on the first or second planar section, wherein walls of the second channel are raised in comparison to the first or second planar surfaces, and wherein the second channel comprises at least one cross-sectional diameter between about 0.1 μm and 500 μm.

26. The method of claim 23, wherein an outline of the channel is printed on the first planar section.

27. The method of claim 23, wherein the channel is applied by printing an area to include the channel, and etching the channel out of the printed area.

28. The method of claim 23, wherein the printed layer is applied by a printing method selected from the group consisting of Serigraph printing, ink jet printing, intaligo printing, offset press printing, and thermal laser printing.

29. The method of claim 23, wherein the first channel is made by applying a mask comprising a shape corresponding to the first channel on the first planar section, applying a first printed coating over the first planar section, and removing the mask, thereby providing the first channel.

30. The method of claim 23, wherein the first channel is made by applying a first printed coating over the first planar section, applying a mask onto the first coating, thereby exposing a shape corresponding to the first channel on the first coating, etching the first channel out of the first coating and removing the mask to provide the first channel.

31. The method of claim 23, further comprising clamping the first and second surfaces together.

32. The method of claim 23, further comprising providing a spacer between the first and second surfaces to provide a uniform distance between the first and second sections on the first and second surfaces.

33. The method of claim 23, wherein the channel is applied by printing the channel using a print material selected from the group consisting of a wax, a thermoplastic, an epoxy, a pressure sensitive material, and a photo-resistive material.

34. The method of claim 23, wherein the channel is laminated between the first and second surfaces.

35. The method of claim 23, wherein the method further comprises die cutting the first and second surfaces.

36. The method of claim 23, wherein the method comprises printing the channel on the first or second surface, and lamination of the first and second surfaces, thereby providing a laminate with the channel disposed between the first and second surfaces.

37. The method of claim 23, wherein the method comprises printing the channel on the first or second surface, lamination of the first and second surfaces, thereby providing a laminate with the channel disposed between the first and second surfaces, and cutting the laminate into at least two pieces, thereby producing two laminates.

\* \* \* \* \*

UNITED STATES PATENT AND TRADEMARK OFFICE
CERTIFICATE OF CORRECTION

PATENT NO.    : 6,074,725
DATED         : June 13, 2000
INVENTOR(S)   : Colin Kennedy et al.

Page 1 of 1

It is certified that error appears in the above-identified patent and that said Letters Patent is hereby corrected as shown below:

Column 19,
Lines 51-64, Claim 1 should read as follows:

-- 1. A laminate comprising:

a first surface comprising a first planar section;

a second surface comprising a second planar section; and, a first microscale channel disposed between the first planar section and the second planar section, said first channel comprising at least one cross-sectional dimension between about .1µm and 500µm, which first channel comprises a first wall and a second wall in contact with the first planar section and the second planar section, which first and second walls are raised in comparison to the first or second planar surfaces, wherein the walls are formed from an intermediate printed layer, and wherein the first or second wall is bonded to the first or second surface. --

Column 20,
Lines 14, after "miscroscale channel," insert -- which microscale channel comprises at least one cross-sectional dimension between about 0.1µm and about 500µm, --

Signed and Sealed this

Fourteenth Day of August, 2001

*Attest:*

*Attesting Officer*

NICHOLAS P. GODICI
*Acting Director of the United States Patent and Trademark Office*